(12) United States Patent
Lo et al.

(10) Patent No.: US 12,500,113 B2
(45) Date of Patent: Dec. 16, 2025

(54) WORKPIECE CHUCK, WORKPIECE HANDLING APPARATUS, MANUFACTURING METHOD OF SEMICONDUCTOR PACKAGE

(71) Applicant: Taiwan Semiconductor Manufacturing Company, Ltd., Hsinchu (TW)

(72) Inventors: Yu-Ching Lo, Hsinchu (TW);
Ching-Pin Yuan, Hsinchu (TW);
Wei-Jie Huang, New Taipei (TW);
Cheng-Yu Kuo, Kaohsiung (TW);
Yi-Yang Lei, Taichung (TW);
Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 448 days.

(21) Appl. No.: 17/889,362

(22) Filed: Aug. 16, 2022

(65) Prior Publication Data

US 2024/0063048 A1     Feb. 22, 2024

(51) Int. Cl.
*H01L 21/683* (2006.01)
*H01L 21/48* (2006.01)
(Continued)

(52) U.S. Cl.
CPC ...... *H01L 21/6838* (2013.01); *H01L 21/4853* (2013.01); *H01L 21/568* (2013.01);
(Continued)

(58) Field of Classification Search
CPC ............ H01L 21/6838; H01L 21/4853; H01L 21/568; H01L 24/24; H01L 24/32; H01L 24/73; H01L 24/82; H01L 24/83; H01L 24/92; H01L 2224/24227; H01L 2224/244; H01L 2224/32225; H01L 2224/73267; H01L 2224/82005; H01L 2224/83005; H01L 2224/92244; H01L 23/49816; H01L 23/5383; H01L 23/3128; H01L 23/5389; H01L 23/3171; H01L 2221/68327;
(Continued)

(56) References Cited

U.S. PATENT DOCUMENTS

| | | | | |
|---|---|---|---|---|
| 4,848,639 A | * | 7/1989 | Belanger, Jr. ..... | H01L 21/67144 228/5.5 |
| 4,858,975 A | * | 8/1989 | Ogawa ................. | B65G 47/911 414/737 |

(Continued)

OTHER PUBLICATIONS

"Office Action of Taiwan Counterpart Application", issued on Oct. 31, 2023, p. 1-p. 4.

*Primary Examiner* — Vu A Vu
(74) *Attorney, Agent, or Firm* — JCIPRNET

(57) ABSTRACT

A workpiece chuck includes a supporting platform, a vacuum system, and a gas permeable buffer layer. The supporting platform has a supporting surface for holding a workpiece thereon. The vacuum system is disposed under and in gas communication with the supporting platform. The gas permeable buffer layer is disposed over the supporting platform and covers the supporting surface, wherein a hardness scale of the gas permeable buffer layer is smaller than a hardness scale of the supporting platform.

14 Claims, 19 Drawing Sheets

(51) Int. Cl.
*H01L 21/56* (2006.01)
*H01L 23/00* (2006.01)

(52) U.S. Cl.
CPC .............. *H01L 24/24* (2013.01); *H01L 24/32* (2013.01); *H01L 24/73* (2013.01); *H01L 24/82* (2013.01); *H01L 24/83* (2013.01); *H01L 24/92* (2013.01); *H01L 2224/24227* (2013.01); *H01L 2224/244* (2013.01); *H01L 2224/32225* (2013.01); *H01L 2224/73267* (2013.01); *H01L 2224/82005* (2013.01); *H01L 2224/83005* (2013.01); *H01L 2224/92244* (2013.01)

(58) Field of Classification Search
CPC . H01L 2221/68345; H01L 2221/68359; H01L 2221/68381; H01L 21/6835; H01L 24/19; H01L 24/20
USPC .......................................................... 438/126
See application file for complete search history.

(56) References Cited

U.S. PATENT DOCUMENTS

| | | | | |
|---|---|---|---|---|
| 6,244,493 | B1* | 6/2001 | Shimazaki | H01L 21/68 228/5.5 |
| 6,723,202 | B2* | 4/2004 | Nagaiwa | C23C 16/4581 118/724 |
| 6,836,322 | B2* | 12/2004 | Bae | G01N 21/9501 356/244 |
| 6,870,173 | B2* | 3/2005 | Moon | H01J 37/3175 250/492.24 |
| 7,764,076 | B2* | 7/2010 | Di Stefano | G01M 1/12 73/1.01 |
| 9,011,207 | B2* | 4/2015 | Duescher | B24B 37/042 451/41 |
| 10,170,352 | B2* | 1/2019 | Itonaga | H01L 21/6836 |
| 11,452,853 | B2* | 9/2022 | Li | B29C 33/3842 |
| 11,498,265 | B2* | 11/2022 | Wu | B29C 33/68 |
| 2016/0195579 | A1 | 7/2016 | Simmons et al. | |
| 2019/0096733 | A1 | 3/2019 | Amano et al. | |
| 2021/0335629 | A1 | 10/2021 | Mao et al. | |

* cited by examiner

WORKPIECE CHUCK, WORKPIECE HANDLING APPARATUS, MANUFACTURING METHOD OF SEMICONDUCTOR PACKAGE

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
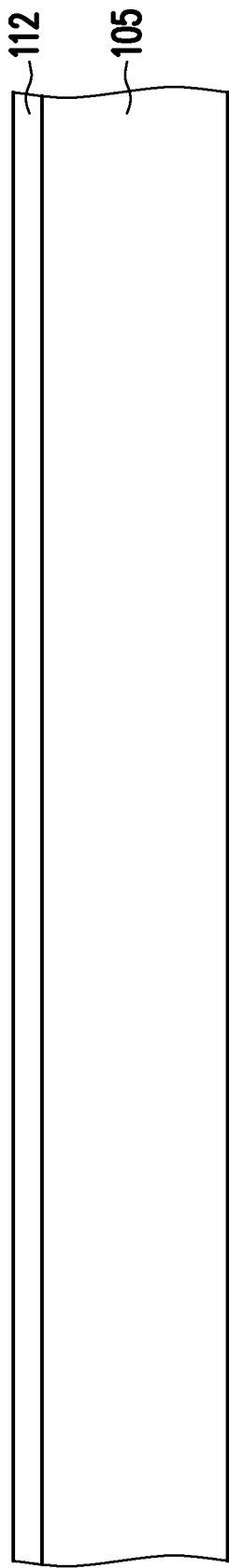
FIG. 1 to FIG. 13 illustrate cross sectional views of intermediate stages in the manufacturing of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 13 illustrate cross sectional views of intermediate stages in the manufacturing of a semiconductor package according to some exemplary embodiments of the present disclosure. It is noted that the present disclosure will be described with respect to some embodiments in a specific context, namely a manufacturing method of a semiconductor package that incorporates a workpiece chuck and a workpiece handling apparatus including workpiece chuck to, for example, attach a dielectric film onto a package structure. In some embodiments, the semiconductor package may be an integrated fan-out package. The concepts in the disclosure may also apply, however, to other semiconductor structures or circuits. The intermediate stages of forming a semiconductor package are illustrated in accordance with some embodiments. The variations of the embodiments are discussed. Throughout the various views and illustrative embodiments, like reference numbers are used to designate like elements.

With reference to FIG. 1, a carrier 105 is provided. In some embodiments, the carrier 105 may include, for example, silicon based materials, such as glass, ceramics or silicon oxide, or other materials, such as aluminum oxide, combinations of any of these materials, or the like. The carrier 105 may be planar in order to accommodate an attachment of a semiconductor device such as a semiconductor device 130 (not illustrated in FIG. 1, but illustrated and discussed below with respect to FIG. 5). In some embodiment, a release layer (not shown) may be disposed on the carrier 105. The release layer 106 may be removed along with carrier 105 from the overlying structures that will be formed in subsequent steps. The release layer may include an adhesive or a glue material. In some embodiments, the release layer may be dispensed as a liquid and cured. In other embodiments, the release layer may be formed by lamination. In some embodiments, the release layer is photosensitive and is easily detached from the carrier 105 by irradiating with ultra-violet (UV) light or laser. For example, the release layer may include a light-to-heat-conversion (LTHC) coating. In some other embodiments, the release layer includes heat-sensitive adhesive.

In some embodiments, a backside redistribution structure 110 (illustrated in FIG. 3) is formed over the carrier 105, or on the release layer (if any). The method of forming the backside redistribution structure 110 shown in FIG. 3 may include the following steps. Firstly, a first dielectric layer 112 may be formed on the carrier 105, or on the release layer (if any). In some embodiments, the first dielectric layer 112 may be formed of dielectric materials such as oxides, nitrides, carbides, carbon nitrides, polybenzoxazole (PBO), polyimide, polyimide derivative, combinations thereof, and/or multi-layers thereof. Any suitable dielectric materials may alternatively be utilized. The first dielectric layer 112 may be placed using, e.g., a spin-coating process to a thickness of between about 2 μm and about 15 lam, such as about 5 μm, although any suitable method and thickness may alternatively be used.

Figure 2:
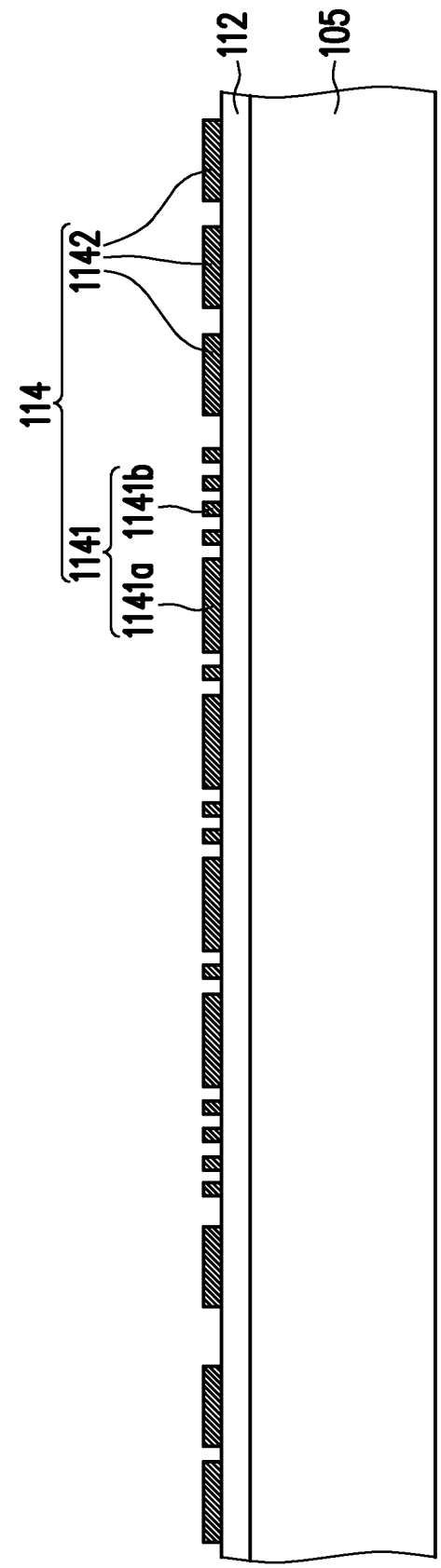
Figure 3:
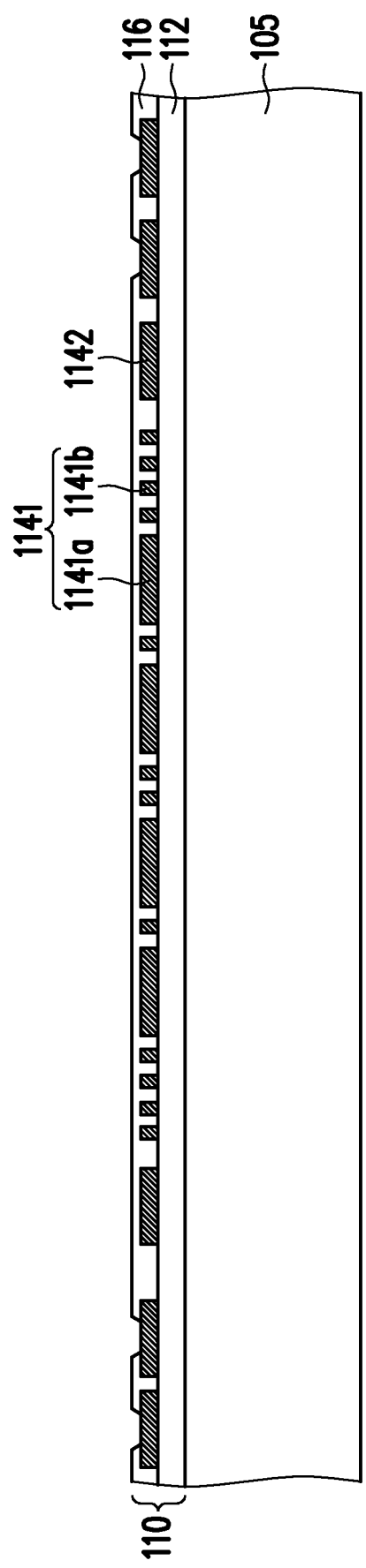

Then, with now reference to FIG. 2, a redistribution circuit layer 114 is formed on first dielectric layer 112. The material of the redistribution circuit layer 114 may include a metal or a metal alloy including aluminum, copper, tungsten, and/or alloys thereof, and the redistribution circuit layer 114 may be formed by, for example, plating process. In accordance with some embodiments of the disclosure, the redistribution circuit layer 114 may include a dummy pattern 1141 and a circuit pattern 1142. The circuit pattern 1142 is configured for forming electrical connection with other components, and the dummy pattern 1141 is electrically insulated from the circuit pattern 1142. In some embodiments, the dummy pattern 1141 may be distributed evenly on the first dielectric layer 112 where the circuit pattern 1142 is not disposed, and is configured to avoid or at least reduce stress concentration of the semiconductor package 100.

Figure 16:
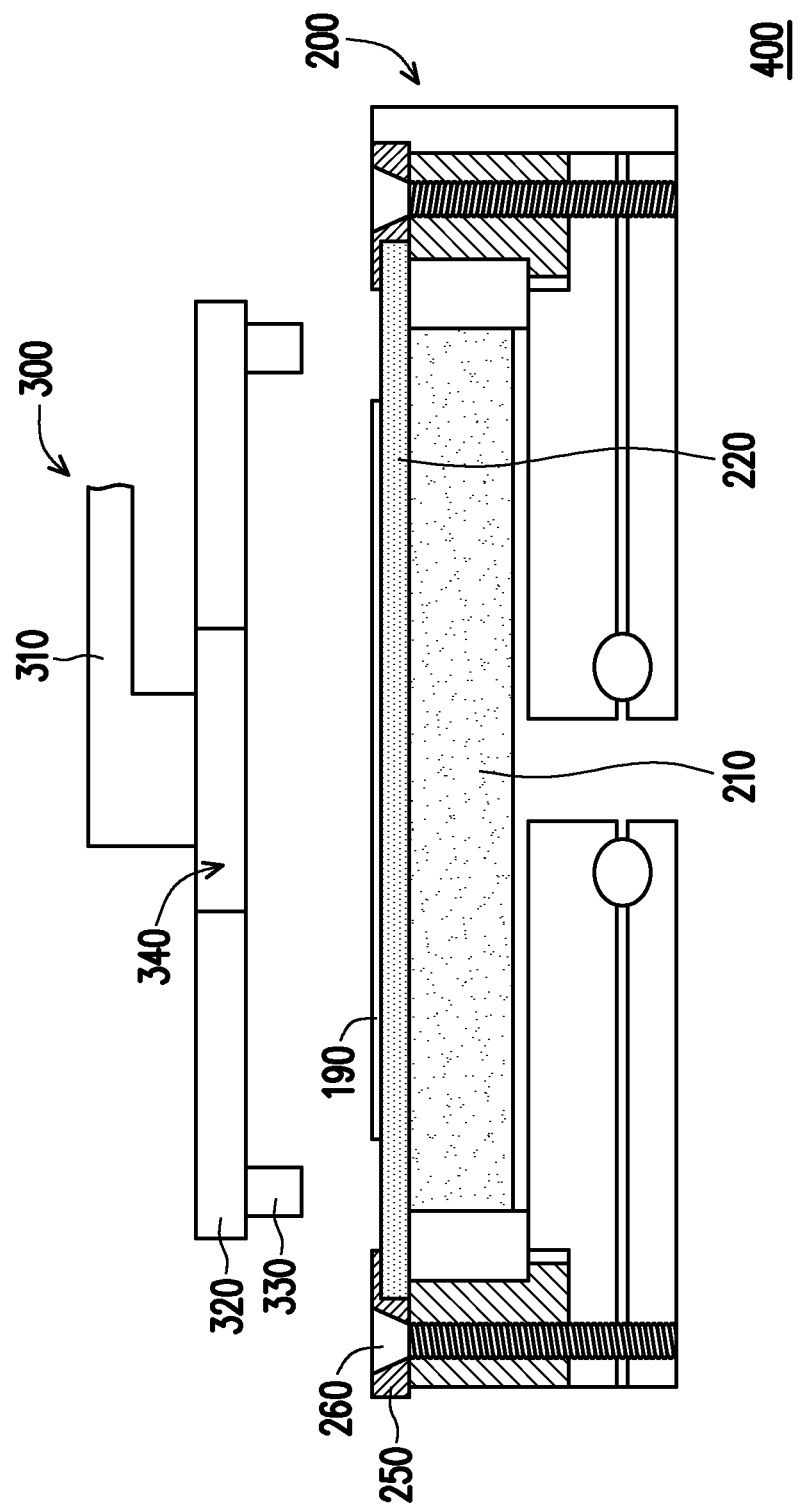

In accordance with some embodiments of the disclosure, referring to FIG. 16, a second patterned dielectric layer 116 may be formed on the redistribution circuit layer 114. In some embodiments, the second dielectric layer 116 may cover the dummy pattern 1141 and reveals the circuit pattern 1142 underneath, such that the circuit pattern 1142 can be electrically connected to the overlying structures such as through vias 120 shown in FIG. 4. The second patterned dielectric layer 116 may be utilized in order to provide protection to, for example, the semiconductor device 130 shown in FIG. 5 once the semiconductor device 130 have been attached. In an embodiment, the insulating layer may be polybenzoxazole (PBO), although any suitable material, such as polyimide or a polyimide derivative, may alternatively be utilized. The material and the forming method of the second patterned dielectric layer 116 may be the same or similar to those of the first dielectric layer 112. It is noted that the present embodiment is merely for illustration. More dielectric layers and redistribution circuit layers may be stacked alternately with one another to form the backside redistribution structure 110.

Figure 4:
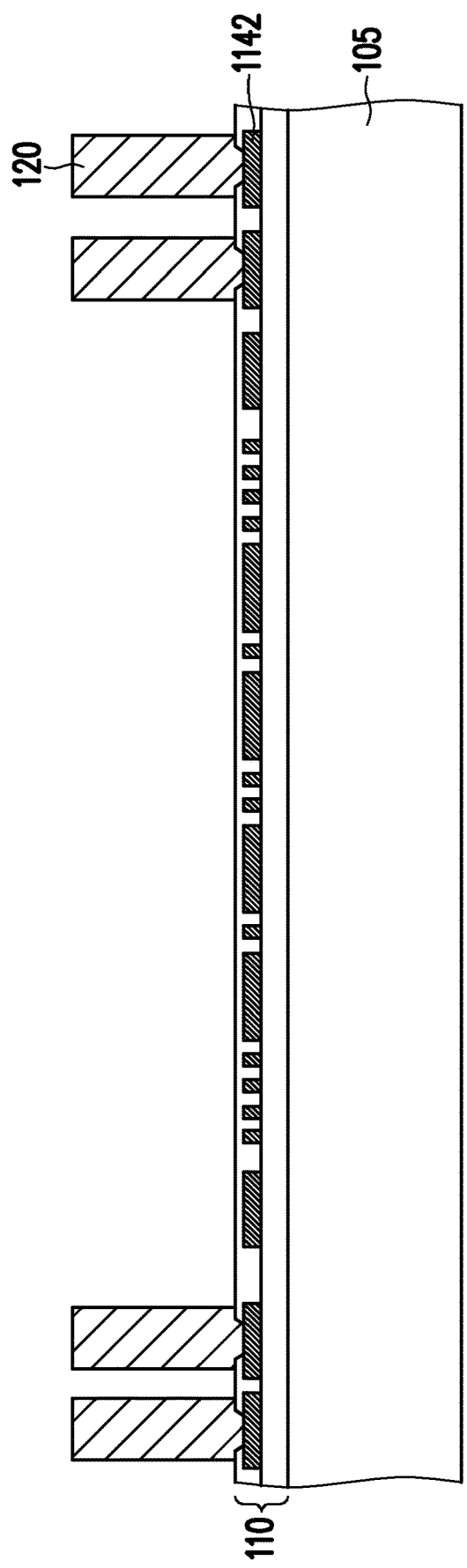

Then, referring to FIG. 4, a plurality of through vias (conductive pillars) 120 are provided on the backside redistribution structure 110, and the through vias 120 surrounds a device area where the semiconductor device 130 to be disposed. In some embodiment, the through vias 120 are formed on and electrically connected to the circuit pattern 1142 of the redistribution circuit layer 114 by, for example, a plating process, but the disclosure is not limited thereto. In other embodiments, the through vias 120 may be preformed.

In the embodiment of the through vias 120 formed on the backside redistribution structure 110, the formation of the through vias 120 may include the following steps. Firstly, a seed layer may be formed over the backside redistribution structure 110. The seed layer is a thin layer of a conductive material that aids in the formation of a thicker layer during subsequent processing steps. The seed layer may be created using processes such as sputtering, evaporation, or PECVD processes, depending upon the desired materials.

Then, a photoresist is formed over the seed layer. In an embodiment, the photoresist may be placed on the seed layer using, e.g. a spin coating technique. Once in place, the photoresist may then be patterned by exposing the photoresist to a patterned energy source (e.g. a patterned light source), thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. The pattern formed into the photoresist is a pattern for the through vias 120.

Then, the through vias 120 are formed in the photoresist by, for example, electroplating, electroless plating, or the like. In an embodiment, the through vias 120 include one or more conductive materials, such as copper, tungsten, other conductive metals, or the like. In an embodiment, an electroplating process is used for plating the exposed conductive areas of the seed layer within the opening of the photoresist. Once the through vias 120 are formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer.

Then, the exposed portions of the seed layer (e.g., those portions that are not covered by the through vias 120) may be removed by, for example, a wet or dry etching process. For example, in a dry etching process reactants may be directed towards the seed layer, using the through vias 120 as masks. Alternatively, etchants may be sprayed or otherwise put into contact with the seed layer in order to remove the exposed portions of the seed layer. At this point, the formation of the through vias 120 is substantially done. The through vias 120 are formed in such a placement as to be located on different sides of subsequently attached semiconductor device 130. In other words, the semiconductor device 130 are surrounded by the through vias 120. However, any suitable arrangement for the pattern of through vias 120 may alternatively be utilized.

Figure 5:
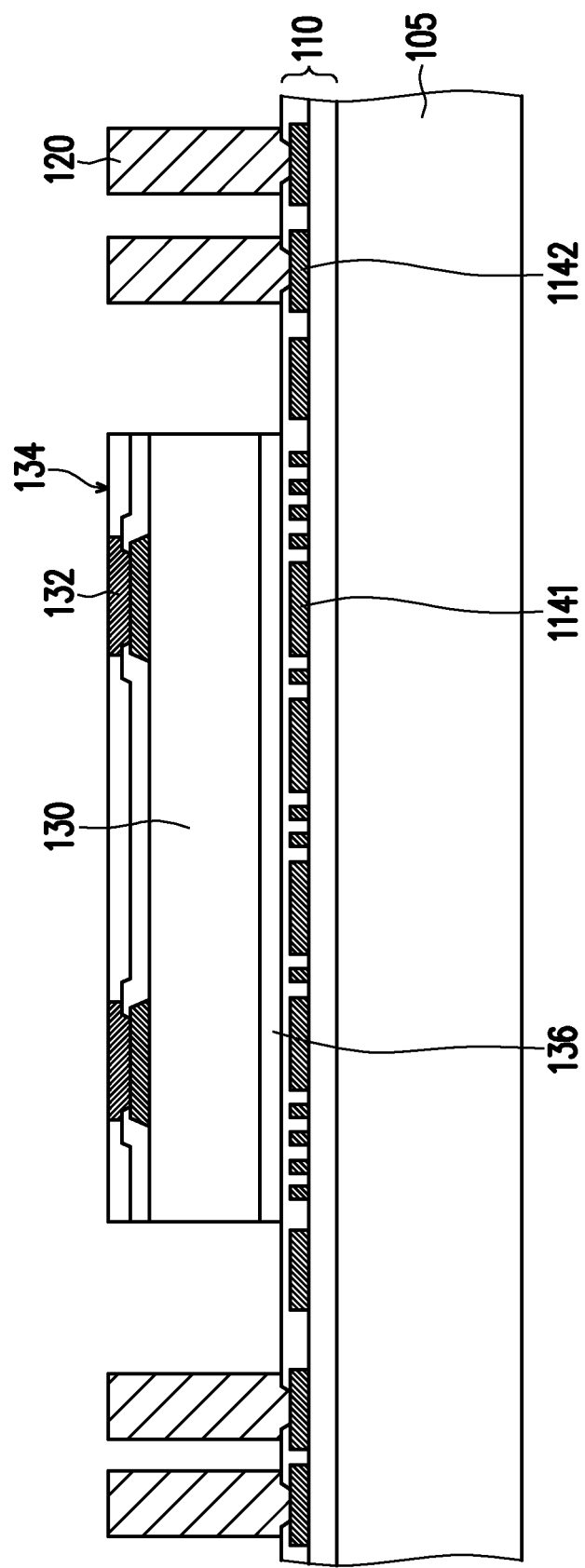

With reference now to FIG. 5, in some embodiments, at least one semiconductor device 130 (one semiconductor device 130 are illustrated, but not limited thereto) may be provided on the backside redistribution structure 110 and within or between the through vias 120. In some embodiments, the dummy pattern 1141 may be overlapped with the semiconductor device 130 from a top view of the semiconductor package. In accordance with some embodiments of the disclosure, the semiconductor device 130 may be disposed on a central region of the backside redistribution structure 110 while the through vias 120 are disposed on a peripheral region surrounding the central region. In some embodiments, the dummy pattern 1141 is disposed within the central region corresponding to the semiconductor device 130 for avoiding or reducing stress concentration on the semiconductor device 130, and the circuit pattern 1142 is disposed within the peripheral region corresponding to the through vias 120 for being electrically connected to the through vias 120. It is noted that "central" and "peripheral" herein may not be interpreted literally but rather be deemed as spatially relative terms, which are intended to encompass different orientations of the device in use or operation in addition to the orientation depicted in the figures.

In some embodiments, the semiconductor device 130 may include at least one semiconductor device set. The semiconductor device set may include a plurality of semiconductor devices electrically connected through, e.g., a front side redistribution structure 150 (not illustrated in FIG. 5 but illustrated and discussed below with respect to FIG. 7) and may be utilized together in order to provide a desired functionality to an end user. In some embodiments, the semiconductor device 130 may be attached to the backside redistribution structure 110 using an adhesive material 136 such as a die attach film (DAF), although any suitable method of attachment may alternatively be utilized. The through vias 120 may surround the semiconductor device 130. In some embodiments, the semiconductor device 130 may be a logic device die including logic circuits therein. In some exemplary embodiments, the semiconductor device 130 may be a device that is designed for mobile applications, and may include a Power Management Integrated Circuit (PMIC) die and a Transceiver (TRX) die, for example. It is noted that more or less semiconductor device 130 may be placed over the backside redistribution structure 110 and level with one another.

In some exemplary embodiments, the semiconductor device 130 may include an active surface 134, a plurality of electrical contacts 132 disposed on the active surface 134 and a back surface opposite to the active surface 134. In some embodiments, the semiconductor device 130 may be disposed on the backside redistribution structure 110 with the active surface 134 facing away from the backside redistribution structure 110. Namely, the back surface of the semiconductor device 130 faces the backside redistribution structure 110. In some embodiments, the electrical contacts 132 may be formed on the active surface (e.g. the top surface) of the semiconductor device 130. The substrate of the semiconductor device 130 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The semiconductor device 130 may further include a wide variety of active devices and passive devices such as capacitors, resistors, inductors and the like that may be used to generate the desired structural and functional requirements of the design for the semiconductor device 130. The active devices may be formed using any suitable methods either within or else on the substrate.

In accordance with some embodiments of the disclosure, a passivation layer may be formed on the active surface 134 of the semiconductor device 130, and may cover the top surfaces of the electrical contacts 132. In other embodiments, the top surface of the passivation layer may be substantially level with the top surfaces of the electrical contacts 132. Alternatively, the passivation layer may be omitted, and the electrical contacts 132 protrude from the active surface 134 of the semiconductor device 130. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized. In some embodiments, the top ends of the through vias 120 may be substantially level with the top surfaces of the electrical contacts 132. In other embodiments, the top ends of the through vias 120 may be substantially higher than the top surfaces of the electrical contacts 132. Alternatively, the top ends of the through vias 120 may be substantially lower than the top surfaces of the electrical contacts 132 but substantially higher than the bottom surfaces of the electrical contacts 132.

Figure 6:
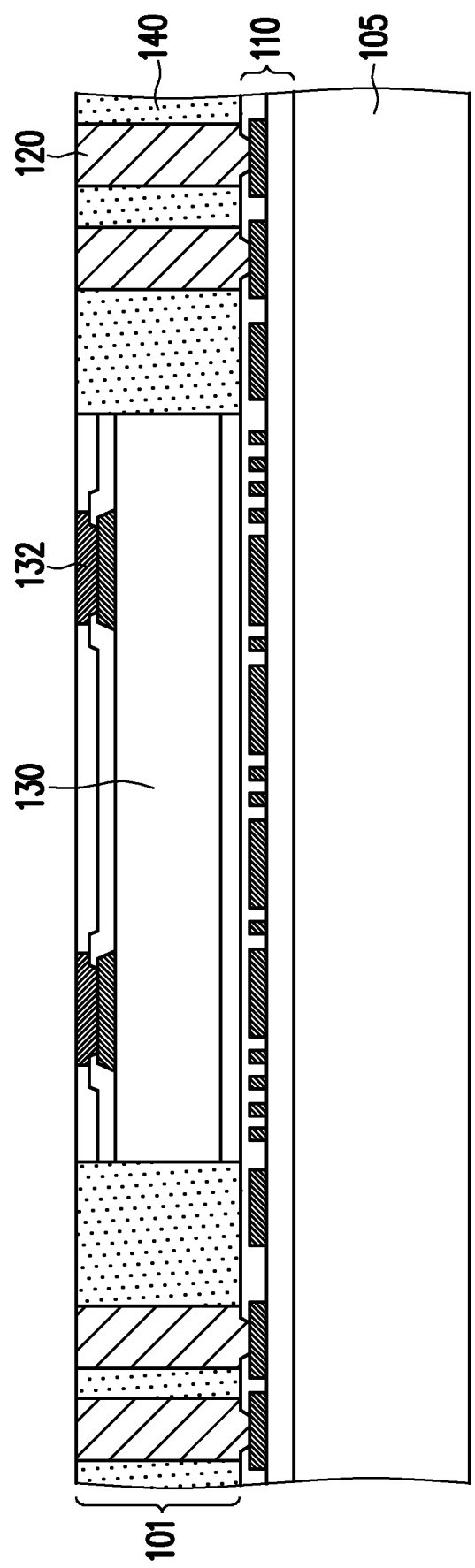

With reference now to FIG. 6, in some embodiments, an encapsulating material 140 is formed on the backside redistribution structure 110 to encapsulate the through vias 120 and the semiconductor device 130. In some embodiments, the encapsulating material 140 fills the gaps between the semiconductor device 130 and the through vias 120, and may be in contact with the backside redistribution structure 110. The encapsulating material 140 may include a molding compound resin such as polyimide, PPS, PEEK, PES, a heat resistant crystal resin, combinations of these, or the like. The encapsulation of the semiconductor device 130 and the through vias 120 may be performed in a molding device (not shown). The encapsulating material 140 may be placed within a molding cavity of the molding device, or else may be injected into the molding cavity through an injection port.

Once the encapsulating material 140 has been placed into the molding cavity such that the encapsulating material 140 encapsulates the backside redistribution structure 110, the semiconductor device 130 and the through vias 120, the encapsulating material 140 may be cured in order to harden the encapsulating material 140 for optimum protection. Additionally, initiators and/or catalysts may be included within the encapsulating material 140 to better control the curing process. In some embodiments, a top surface of the encapsulating material 140 may be higher than the top ends of the through vias 120 and the top surface of the semiconductor device 130. Namely, the encapsulating material 140 covers the top ends of the through vias 120 and the top surface of the semiconductor device 130.

Then, a thinning process may be performed on the encapsulating material 140 to reveal the top ends of the through vias 120 and the top surfaces of the electrical contacts 132 for further processing. The thinning process may be, for example, a mechanical grinding or CMP process whereby chemical etchants and abrasives are utilized to react and grind away the encapsulating material 140 until the through vias 120, the electrical contacts 132 have been revealed. The resulting structure is shown in FIG. 6. After the thinning process is performed, the top ends of the through vias 120 are substantially level with the top surfaces of the electrical contacts 132, and are substantially level with the top surface of the encapsulating material 140 and the top surface of the passivation layer (if any) as shown in FIG. 6. However, while the CMP process described above is presented as one illustrative embodiment, it is not intended to be limiting to the embodiments. Any other suitable removal process may alternatively be used to thin the encapsulating material 140 and expose the through vias 120. For example, a series of chemical etches may alternatively be utilized. This process and any other suitable process may alternatively be utilized to thin the encapsulating material 140, the semiconductor device 130 and the through vias 120, and all such processes are fully intended to be included within the scope of the embodiments.

Throughout the description, the resultant structure including the semiconductor device 130, the through vias 120 and the encapsulating material 140 as shown in FIG. 6 is referred to as encapsulated semiconductor device 101. It is noted that the encapsulated semiconductor device 101 may have a wafer form in the process. Accordingly, a plurality of semiconductor packages can be formed concurrently for batch production. For the sake of brevity and clarity, the manufacturing process are described regarding one of the semiconductor packages. In the encapsulated semiconductor device 101, the semiconductor device 130 are disposed at the die area of the backside redistribution structure 110, the through vias 120 extend through the encapsulated semiconductor device 101 outside of the die area, and the encapsulating material 140 encapsulates the semiconductor device 130 and the through vias 120. In other words, the encapsulating material 140 encapsulates the semiconductor device 130 therein, and the through vias 120 extends through the encapsulating material 140. In some embodiments, the second patterned dielectric layer 116 of the backside redistribution structure 110 is located between the encapsulated semiconductor device 101 and the redistribution circuit layer 114 and isolated the dummy pattern 1141 from the encapsulated semiconductor device 101.

Figure 7:
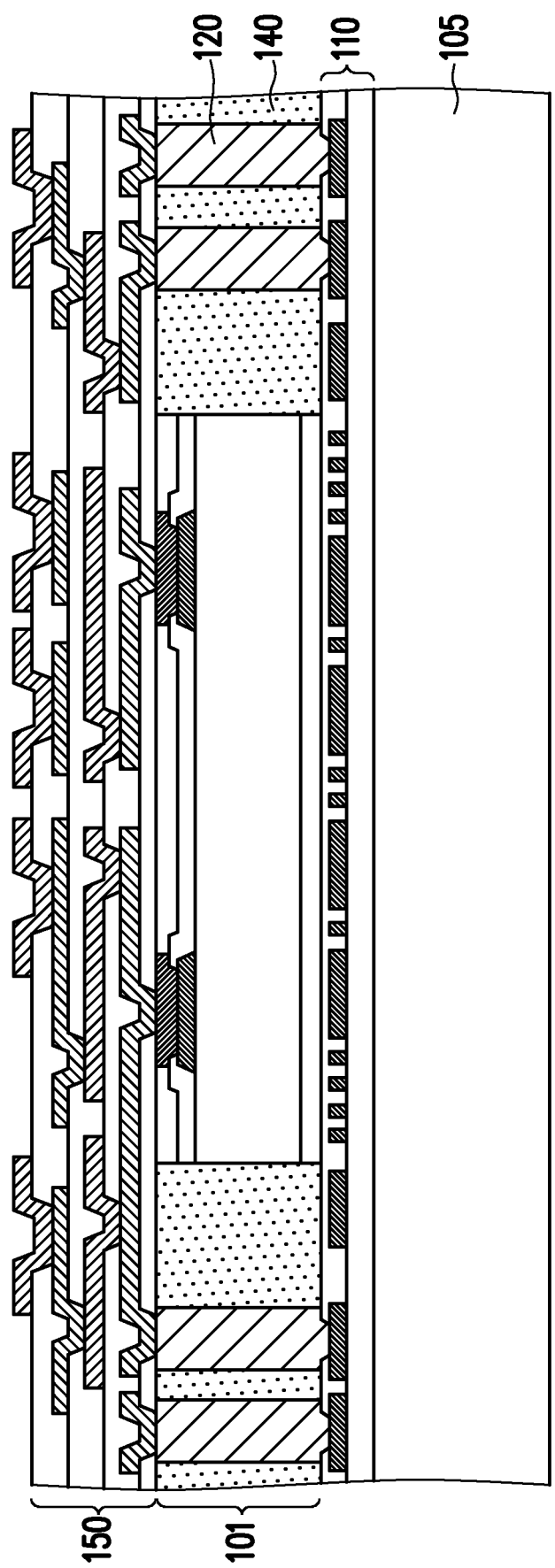

With reference now to FIG. 7, a front side redistribution structure 150 is formed over a front side of the encapsulated semiconductor device 101. In some embodiments, the active surface 134 of the semiconductor device 130 faces the front side redistribution structure 150, and the front side redistribution structure 150 is electrically connected to the semiconductor device 130 and the through vias 120. In some embodiments, the front side redistribution structure 150 are formed over the encapsulated semiconductor device 101 (including the encapsulating material 140 and the semiconductor device 130) to connect to the electrical contacts 132 of the semiconductor device 130 and the through vias 120. In some embodiments, the front side redistribution structure 150 may also interconnect the electrical contacts 132 and the through vias 120. The front side redistribution structure 150 may be formed by, for example, depositing conductive layers, patterning the conductive layers to form redistribution circuit layers, partially covering the redistribution circuit layers and filling the gaps between the redistribution circuit layers with dielectric layers, etc. The material of the redistribution circuit layers may include a metal or a metal alloy including aluminum, copper, tungsten, and/or alloys thereof. The dielectric layers may be formed of dielectric materials such as oxides, nitrides, carbides, carbon nitrides, combinations thereof, and/or multi-layers thereof. The redistribution circuit layers are formed in the dielectric layers and electrically connected to the semiconductor device 130 and the through vias 120. In some embodiments, the backside redistribution structure 110 is located on a backside of the encapsulated semiconductor device 101 opposite to the front side where the front side redistribution structure 150 is disposed. That is to say, the front side redistribution structure 150 and the backside redistribution structure 110 are respectively disposed on two opposite sides of the encapsulated semiconductor device 101.

Figure 8:
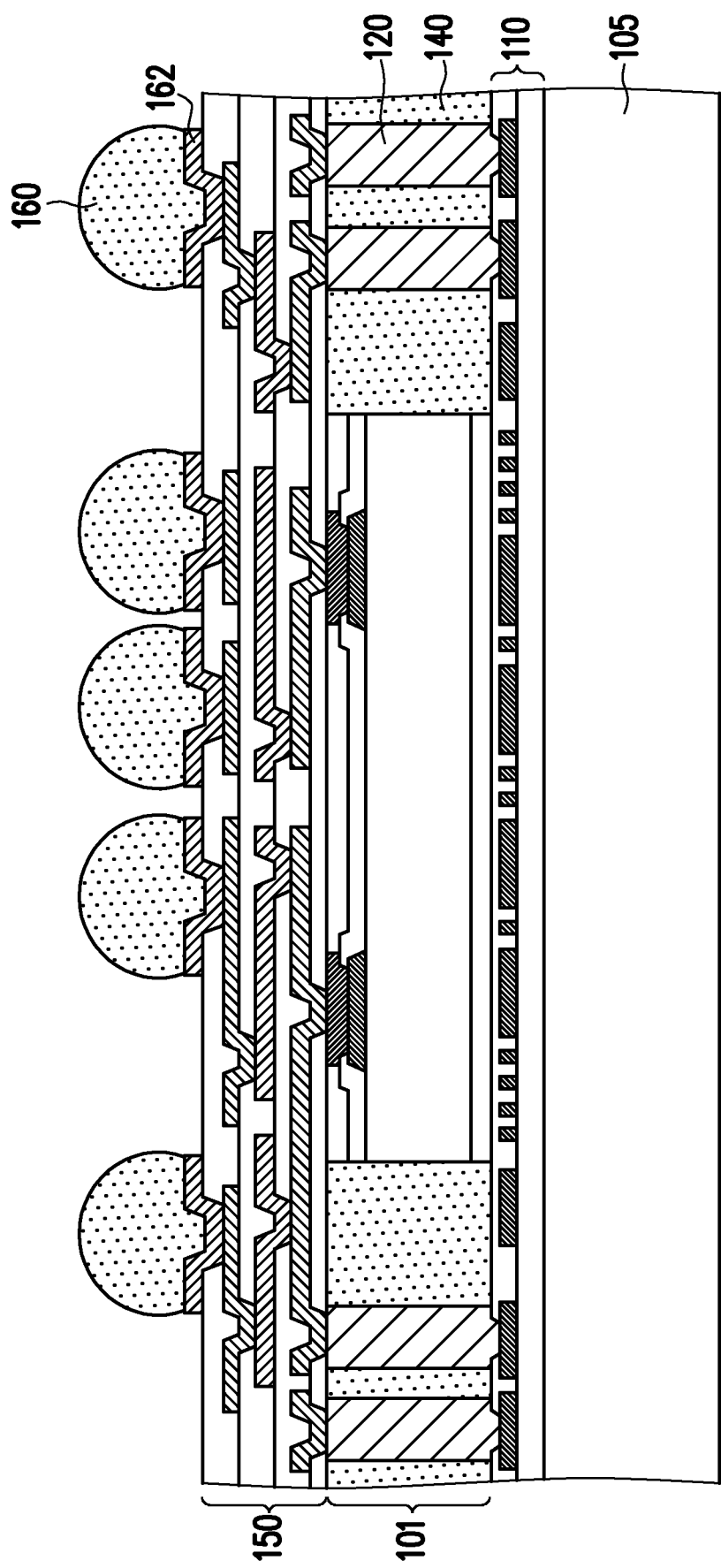

With reference now to FIG. 8, a plurality of conductive bumps 160 are disposed on the front side redistribution structure 150. In some embodiments, an under bump metallurgy (UBM) layer 162 may be formed on the front side redistribution structure 150 by sputtering, evaporation, or electroless plating, etc., and the conductive bumps 160 may be disposed on the UBM layer 162. In some embodiments, at least one integrated passive device (IPD) may also be disposed on the front side redistribution structure 150 in accordance with some exemplary embodiments. The formation of the conductive bumps 160 may include placing solder balls on the UBM layer 162 (or on the front side redistribution structure 150), and then reflowing the solder balls. In alternative embodiments, the formation of the conductive bumps 160 may include performing a plating process to form solder regions on the UBM layer 162 (or on the first redistribution structure 140), and then reflowing the solder regions. The IPD may be fabricated using standard wafer fabrication technologies such as thin film and photolithography processing, and may be mounted on the UBM layer 162 (or on the front side redistribution structure 150) through, for example, flip-chip bonding or wire bonding, etc.

Throughout the description, the resultant structure overlaying the carrier 105 that includes the front side redistribution structure 150, the encapsulated semiconductor device 101, the backside redistribution structure 110, and the conductive bumps 160 shown in FIG. 8 is referred to as a package structure, which may have a wafer form in the process.

Figure 9:
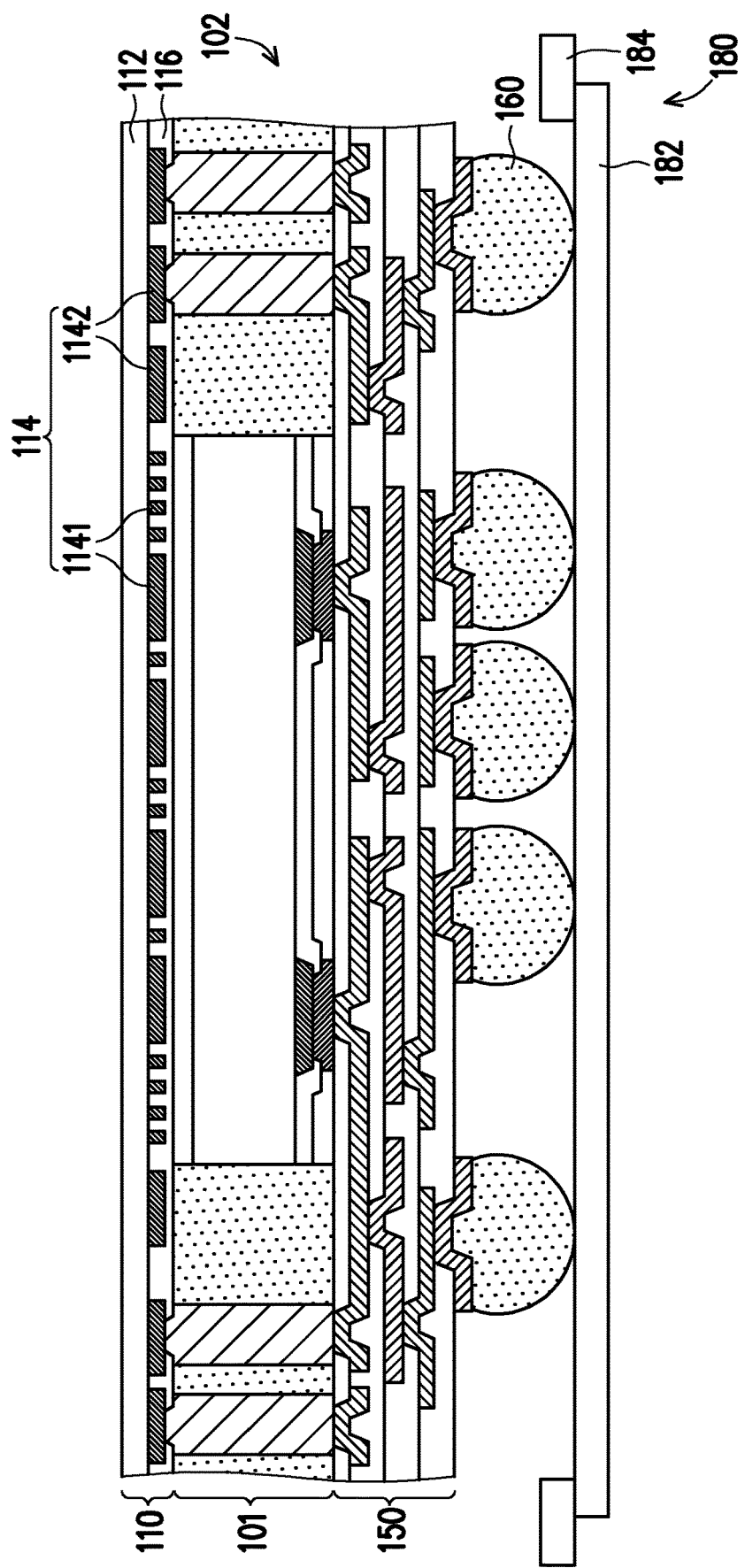

With reference now to FIG. 8 and FIG. 9, then, the carrier 105 may be inverted and the conductive bumps 160 may be mounted (e.g. frame mounted) onto a carrier substrate 180. That is, the package structure with the carrier 105 shown in FIG. 8 may firstly be flipped over to be disposed on a carrier substrate 180 by attaching the conductive bumps 160 to the carrier substrate 180. In some embodiments, the carrier substrate 180 may include a tape carrier 182 with a frame structure 184 intended to provide support and stability for the structure during the sequential process. In an alternative embodiment, the carrier substrate 180 may be the same as or similar to the carrier 105. Then, the carrier 105 may be removed from the backside redistribution structure 110, e.g. by decomposing the release layer on the carrier 105 under heat or light, thereby releasing the carrier 105 from the release layer. Accordingly, a back surface, e.g., a surface of the first dielectric layer 112, is revealed. The carrier 105 may be removed using, for example, a thermal process to alter the adhesive properties of the release layer on the carrier 105. In an embodiment, an energy source such as an ultraviolet (UV) laser, a carbon dioxide ($CO_2$) laser, or an infrared (IR) laser, is utilized to irradiate and heat the release layer until the release layer loses at least some of its adhesive properties. Once performed, the carrier 105 and the release layer thereon may be physically separated and removed from the package structure 102 as it is shown in FIG. 9. In other embodiments, a thermal debonding process or a laser debonding process may be utilized, depending upon the precise adhesive chosen for the release layer.

Figure 10:
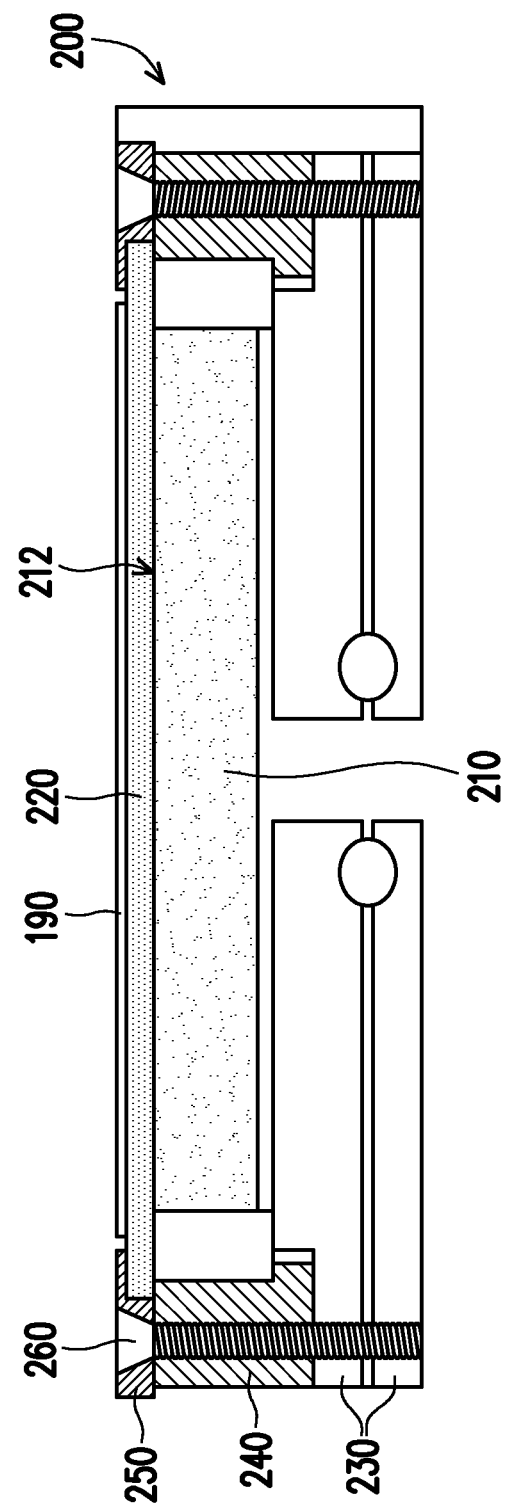
Figure 14:
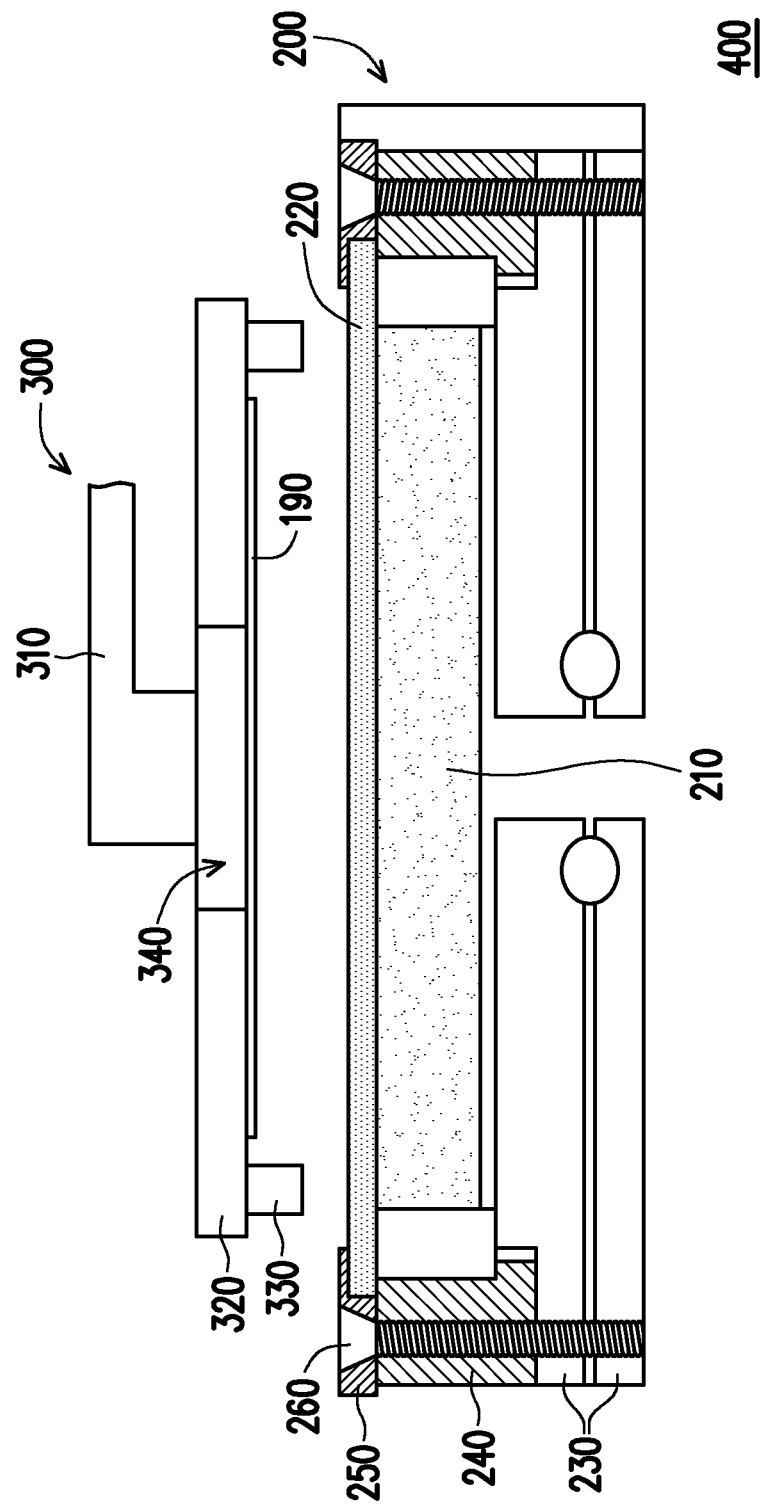
FIG. 14 to FIG. 16 illustrate cross sectional views of intermediate stages in the manufacturing of a semiconductor package incorporating a workpiece handling apparatus according to some exemplary embodiments of the present disclosure.

Then, referring to FIG. 10, a dielectric film 190 is provided over a workpiece chuck 200 of a workpiece handling apparatus, e.g., the workpiece handling apparatus 400 shown in FIG. 14. In some embodiments, the dielectric film 190 may be picked up and placed on the workpiece chuck 200 by a robotic device, e.g., the robotic device 300 shown in FIG. 14. In some embodiments, the workpiece chuck 200 includes a (porous) supporting platform 210, a gas permeable buffer layer 220, and a vacuum system 230. The supporting platform 210 has a supporting surface 212 for holding a workpiece thereon. In the present embodiment, the workpiece is a dielectric film 190 that is going to be attached to the package structure 102 shown in FIG. 9. In some embodiments, the dielectric film 190 may include Ajinomoto Build-Up Film (ABF), film type polyimide, film type molding compound with soft and tackiness at high temperature (e.g., temperature range: 60° C. to 150° C.), or the like. In other embodiments, the dielectric film 190 may include dielectric materials such as oxides, nitrides, carbides, carbon nitrides, polybenzoxazole (PBO), polyimide, polyimide derivative, combinations thereof, and/or multi-layers thereof. Any suitable dielectric materials may alternatively be utilized. It is noted that, in other embodiment, the workpiece could be any other suitable object for the workpiece chuck 200 to hold and support during the sequential process.

In some embodiments, the supporting platform 210 is generally circular in shape and may be fabricated from porous materials such as ceramic materials. For example, the material of the porous supporting platform 210 includes aluminum oxide ($Al_2O_3$), silicon carbide (SiC), or silicon nitride ($Si_3N_4$), or any combinations thereof. In some embodiments, the vacuum system 230 is disposed under the porous supporting platform 210 and the vacuum system 230 is in gas communication with the supporting platform 210. The vacuum system 230 is configured to generate reduced pressure between the dielectric film 190 and the workpiece chuck 200 to secure the dielectric film 190 on the workpiece chuck 200.

In accordance with some embodiments of the disclosure, the gas permeable buffer layer 220 covers the supporting surface 212 of the porous supporting platform 210, such that the gas permeable buffer layer 220 is sandwiched between the dielectric film 190 and the porous supporting platform 210. In some embodiments, the gas permeable buffer layer 220 is softer and more flexible than the porous supporting platform 210. To be more specific, a hardness scale of the gas permeable buffer layer 220 is smaller than a hardness scale of the supporting platform 210. In one embodiment, the hardness scale of the supporting platform 210 is at least 3 times greater than the hardness scale of the gas permeable buffer layer 220. For example, the porous supporting platform 210 may be made of ceramic materials such as SiC or aluminum oxide with hardness of about 8-9 Mohs scale, while the gas permeable buffer layer 220 may be made of soft plastic material such as rubber, silicone, polytetrafluoroethylene (PTFE), thermoplastic polyurethane elastomer (TPU), hydrogenated styrene-based elastomer (SEPS), or the like, with hardness of about 1-2 Mohs scale. In other scale, for example, the gas permeable buffer layer 220 has flexibility with surface hardness of 20-80 Shore A scale. In addition, the gas permeability is essential to the gas permeable buffer layer 220 since the workpiece chuck 200 utilizes vacuum force provided by the vacuum system 230 to secure the dielectric film 190 in place. Accordingly, in some embodiments, a porosity of the gas permeable buffer layer 220 substantially ranges from about 30% to about 70%. If the porosity of the gas permeable buffer layer 220 is too low (e.g., lower than 30%), the vacuum provided by the vacuum system 230 may not be able to pass through the gas permeable buffer layer 220 to secure the dielectric film 190 in place. On the contrary, if the porosity of the gas permeable buffer layer 220 is too high (e.g., higher than 70%), the gas permeable buffer layer 220 may not have enough mechanical strength to provide buffer between the porous supporting platform 210 and the dielectric film 190.

Figure 11:
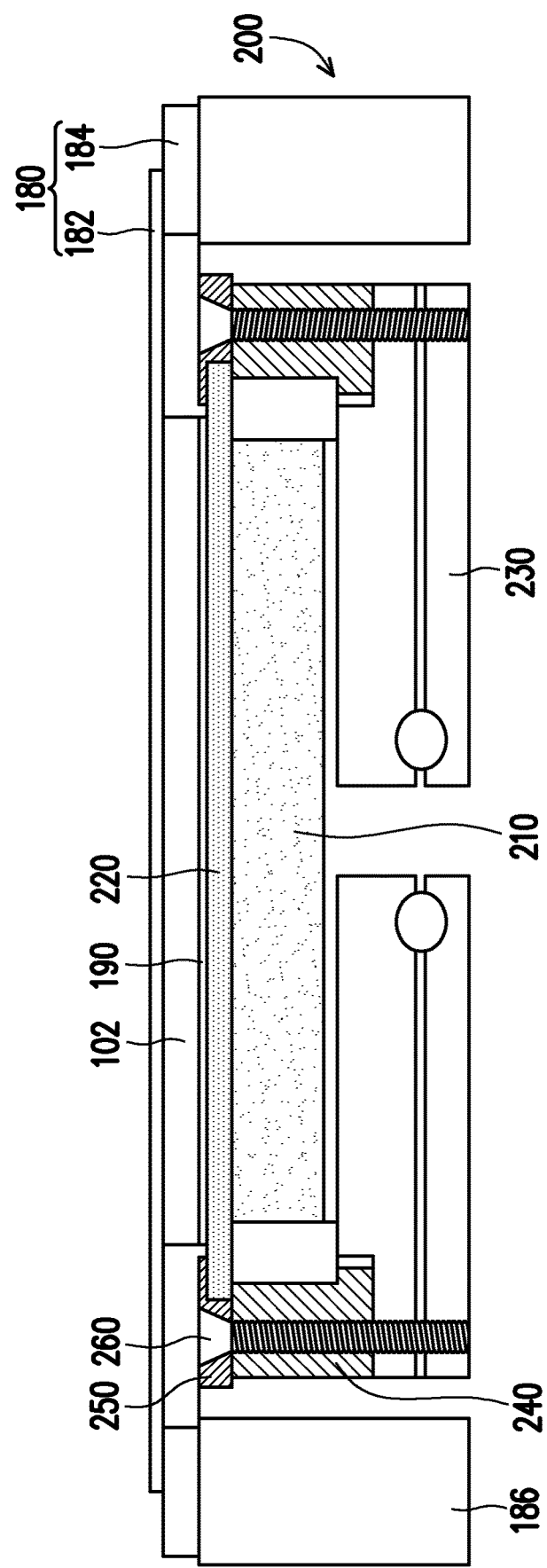

Then, referring to FIG. 11, the dielectric film 190 is attached to the package structure 102 by pressing the package structure 102 against the dielectric film 190 on the gas permeable buffer layer 220. In some embodiments, the package structure 102 along with the carrier substrate 180 is picked up and pressed against the dielectric film 190 over the gas permeable buffer layer 220 of the workpiece chuck 200. For example, the frame structure 184 of the carrier substrate 180 may be placed on a supporter 186 around the workpiece chuck 200, so that the package structure 102 attached thereon can be in contact with the dielectric film 190. Then, a bonding force may be applied by, for example, a pressing head to bond the dielectric film 190 and the package structure 102 together. With the gas permeable buffer layer 220 is sandwiched between the dielectric film 190 and the porous supporting platform 210, the bonding force can be distributed more evenly due to the flexibility and deformability of the gas permeable buffer layer 220. Accordingly, the dielectric film 190 can be in fully contact with the package structure 102 comprehensively without any dimples on the surface of the dielectric film 190 when being attached to the package structure 102. In some embodiments, the thickness of the dielectric film 190 substantially ranges from about 30 μm to about 100 μm while the thickness of the gas permeable buffer layer 220 substantially ranges from 0.3 mm to 0.7 mm, so as to provide enough flexibility for the bonding process s of the dielectric film 190. For example, the thickness ratio of the gas permeable buffer layer 220 to the dielectric film 190 may range from about 3 to about 25. If the thickness ratio of the gas permeable buffer layer 220 to the dielectric film 190 is too small (e.g., smaller than 3), namely, the gas permeable buffer layer 220 is too thin, the gas permeable buffer layer 220 may not be able to provide enough buffer between the porous supporting platform 210 and the dielectric film 190, On the contrary, if the thickness ratio of the gas permeable buffer layer 220 to the dielectric film 190 is too large (e.g., larger than 25), namely, the gas permeable buffer layer 220 is too thick, the vacuum provided by the vacuum system 230 may not be able to pass through the gas permeable buffer layer 220 to secure the dielectric film 190 in place.

Figure 12:
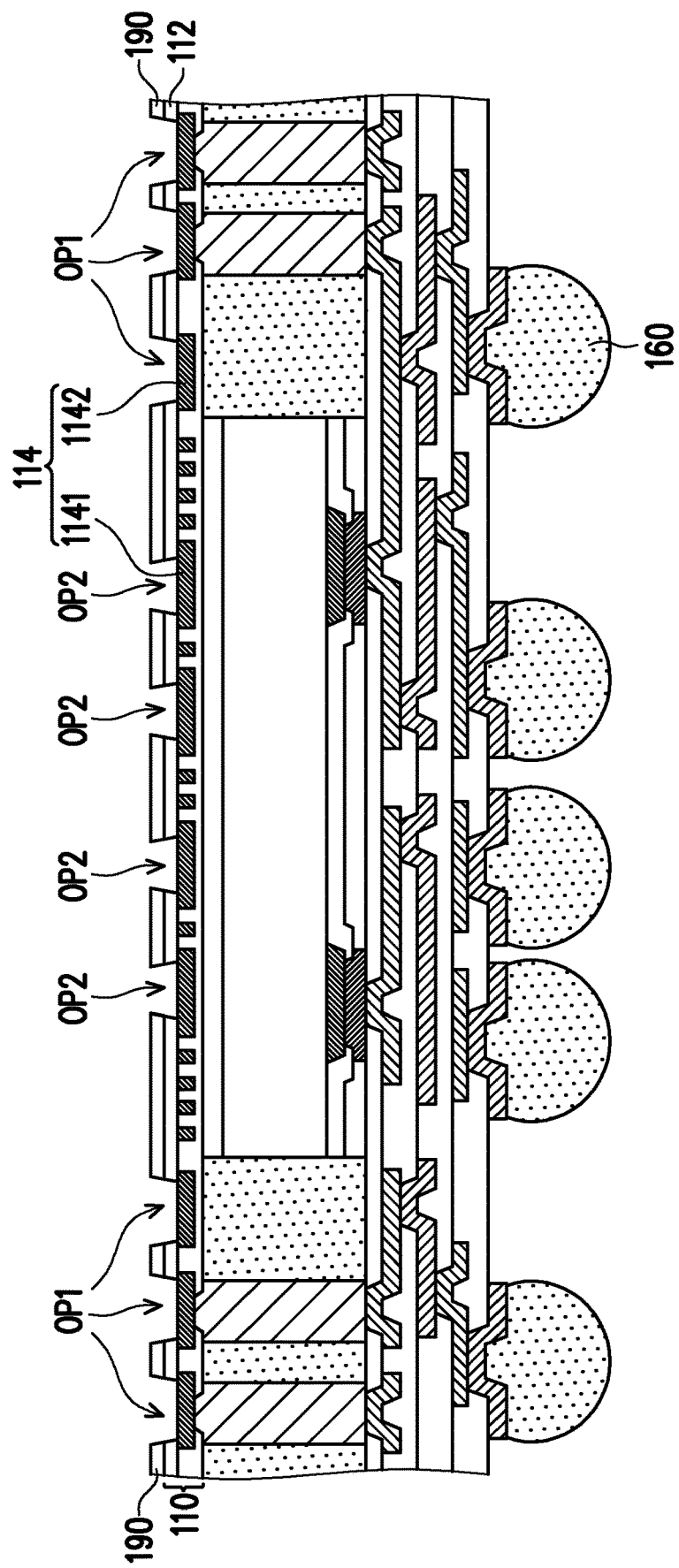

Then, with now reference to FIG. 12, in some embodiments, a patterning process may be performed on the dielectric film 190 attached on the package structure. In accordance with some embodiments of the disclosure, the patterned dielectric film 190 may include a plurality of contact openings OP1 for revealing the circuit pattern 1142 underneath. In some embodiments, the contact openings OP1 may be formed by a patterning process such as a photolithography process or a laser drilling process, but the disclosure is not limited thereto.

In accordance with some embodiments of the disclosure, the patterned dielectric film 190 may further include a marking pattern OP2 to reveal a part of the dummy pattern 1141 underneath. In some embodiments, the marking pattern OP2 may be a patterned opening revealing a part of the dummy pattern 1141 underneath for marking the information such as logo, company name, a part or serial number, or other information such as lot number, etc., on the semiconductor package 100. In an alternative embodiment, the marking pattern OP2 may not reveal any dummy pattern 1141 or circuit pattern 1142, but reveal the dielectric layer underneath.

In some embodiments, the patterning process for forming the marking pattern OP2 may include a laser marking process, or a photolithography process, but the disclosure is not limited thereto. In accordance with some embodiments of the disclosure, the contact openings OP1 and the marking pattern OP2 may be formed by two different patterning process. For example, the contact openings OP1 can be formed by photolithography process for revealing the circuit pattern 1142 underneath, and the marking pattern OP2 is formed by laser marking process to mark the information such as logo, company name, a part, serial number, lot number on the patterned dielectric film 190. In an alternative embodiment, the contact openings OP1 and the marking pattern OP2 may be formed by the same patterning process such as photolithography process or laser process in one step. The disclosure is not limited thereto.

Figure 13:
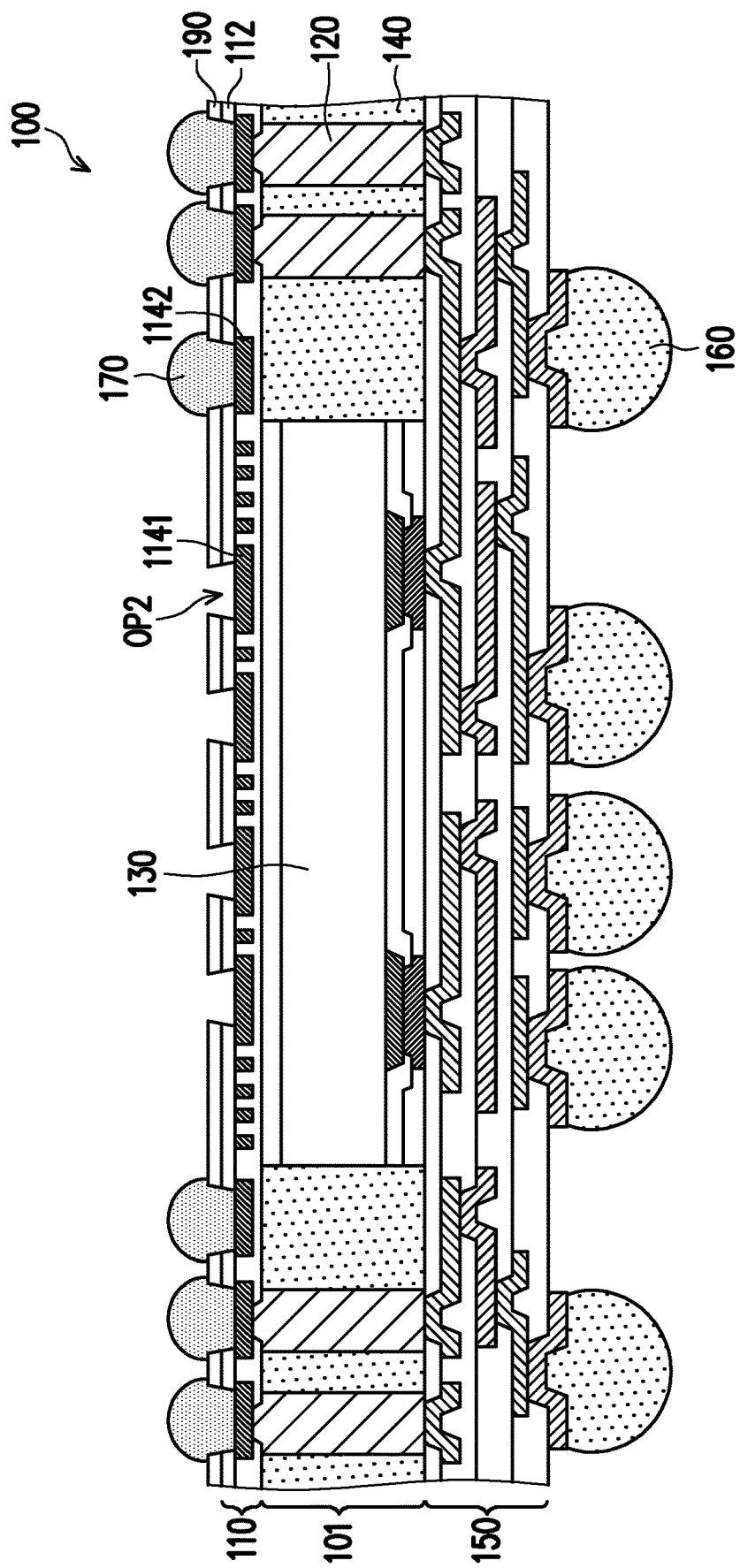

With now reference to FIG. 13, in some embodiments, a plurality of conductive bumps 170 are disposed on the contact openings OP1 of the patterned dielectric film 190 and electrically connected to the circuit pattern 1142. In some embodiments, an UBM layer may be formed on the backside redistribution structure 110 by sputtering, evaporation, or electroless plating, etc., and the conductive bumps 170 may be disposed on the UBM layer. In some embodiments, at least one IPD may also be disposed on the backside redistribution structure 110 in accordance with some exemplary embodiments. The formation of the conductive bumps 170 may be the same as or similar to that of the conductive bumps 160. In some embodiments, the marking pattern OP2 may be formed before the conductive bumps 170 are disposed on the contact openings OP1. However, in other embodiments, the marking pattern OP2 can be formed after the conductive bumps 170 are disposed on the contact openings OP1. The disclosure does not limit the formation timing of the marking pattern OP2. At the time, the manufacturing process of the semiconductor package 100 may be substantially done.

Figure 15:
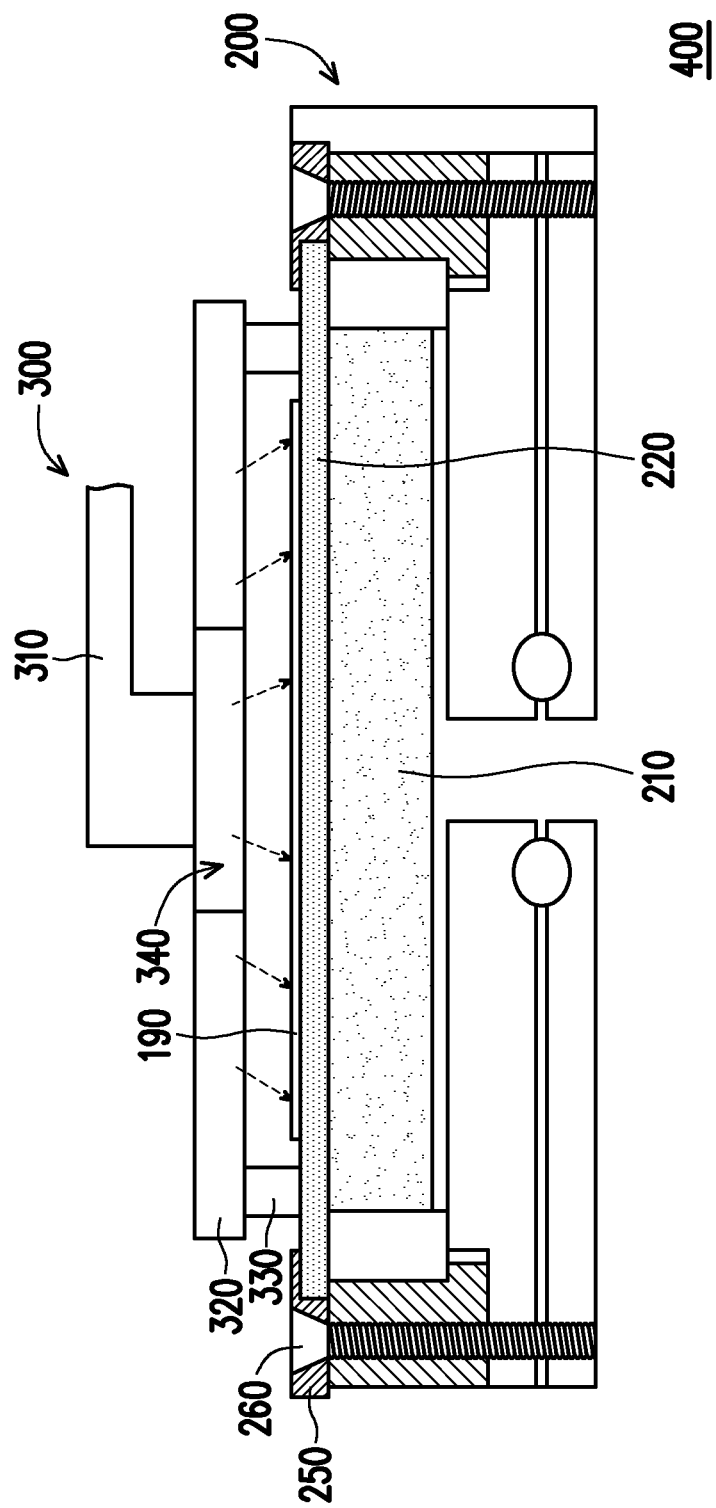

FIG. 14 to FIG. 16 illustrate cross sectional views of intermediate stages in the manufacturing of a semiconductor package incorporating a workpiece handling apparatus according to some exemplary embodiments of the present disclosure. Referring firstly to FIG. 14, in some embodiments, the workpiece handling apparatus 400 includes the workpiece chuck 200 and the robotic device 300 movably disposed over the workpiece chuck 200. The process of providing the dielectric film 190 over the workpiece chuck 200 may include the following steps. Firstly, a suction force is applied by the robotic device 300 to pick up the dielectric film 190. In one embodiment, the robotic device 300 may include a robot arm 310, an end effector 320, and a vacuum manifold 340. In some embodiments, the robot arm 310 is movably disposed over the workpiece chuck 200, and the end effector 320 is connected to the robot arm 310, while the vacuum manifold 340 is in gas communication with the end effector 320. The end effector 320 may be in a disc shape and configured to hold the dielectric film 190 thereon through a suction force provided by the vacuum manifold 340. In some embodiments, a vacuum pump may be in gas communication with the vacuum manifold 340 to draw air through the vacuum manifold 340 to create the suction force.

Then, referring to FIG. 15 and FIG. 16, the dielectric film 190 is moved toward the workpiece chuck 200 by the robotic device 300. Developing a sufficiently low pressure within the vacuum manifold 340 generally requires a seal form between the robotic device 300 and the workpiece chuck 200. Accordingly, the robotic device 300 may further include a seal ring 330 surrounding a perimeter of the end effector 320, and the dielectric film 190 is moved toward the workpiece chuck 200 by the robotic device 300 till the seal ring 330 is in contact with the workpiece chuck 200 to create an enclosed (sealed) space between the robotic device 300 and the workpiece chuck 200.

In some embodiments, a flow is provided by the robotic device 300 to push the dielectric film 190 toward the workpiece chuck 200 the robotic device 300 is in contact with the workpiece chuck 200. In the present embodiment, the vacuum pump may be configured to reverse the flow of air through vacuum manifold 340 and blow air outwards from the end effector 320, which provides an additional force to push the dielectric film 190 onto the gas permeable buffer layer 220 of workpiece chuck 200 while the vacuum system 230 provides the suction force for holding dielectric film 190 onto the gas permeable buffer layer 220 of workpiece chuck 200. After the dielectric film 190 is placed onto the workpiece chuck 200 while suction force provided by the vacuum system 230 holds the dielectric film 190 in place, the robotic device 300 may be moved away from the workpiece chuck 200.

Referring back to FIG. 10, in some embodiments, the workpiece chuck 200 may further include a mounting frame 240 and a fixing ring 250 for holding the gas permeable buffer layer 220 in place. The mounting frame 240 surrounds the supporting platform 210 for fixing the supporting platform 210 to the vacuum system 230. The fixing ring 250 is disposed on the gas permeable buffer layer 220 and fixed to the mounting frame 240. In some embodiments, a peripheral region of the gas permeable buffer layer 220 is clamped between the fixing ring 250 and the supporting platform 210. In one embodiment, the fixing ring 250 is fixed to the mounting frame 240 by a plurality of fastening components 260 such as a screw, or the like, extending through the fixing ring 250, the mounting frame 240, and at least a part of the vacuum system 230.

Figure 17:
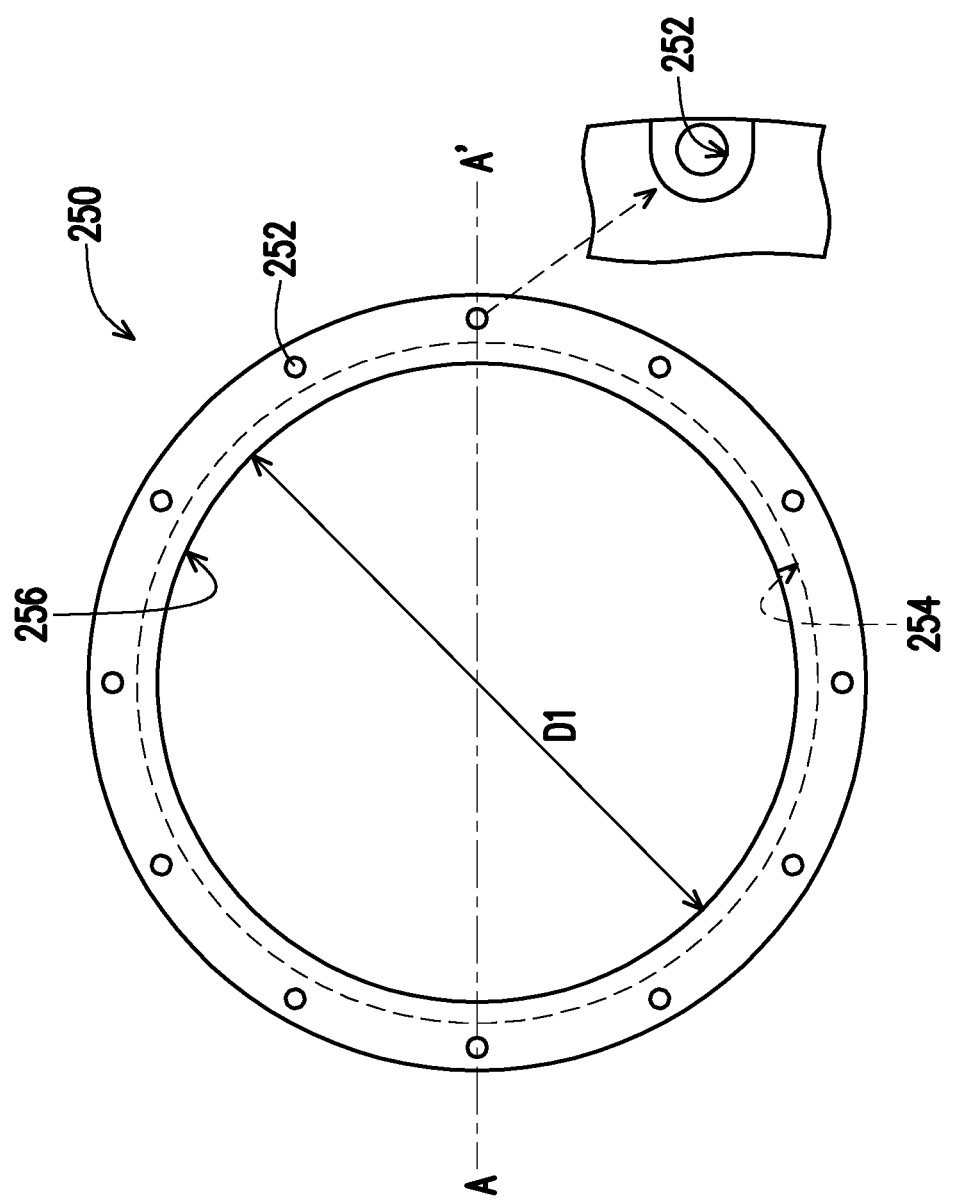
FIG. 17 illustrates a top view of a fixing ring of a workpiece chuck according to some exemplary embodiments of the present disclosure.
Figure 18:
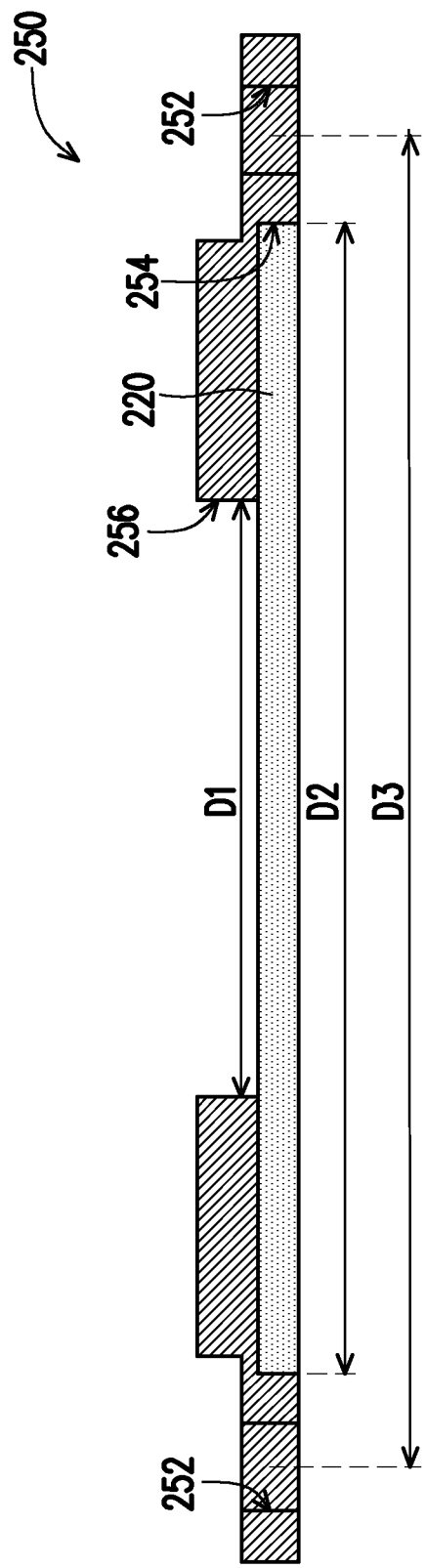
FIG. 18 illustrates a cross-sectional view of the fixing ring with a workpiece according to some exemplary embodiments of the present disclosure.

FIG. 17 illustrates a top view of a fixing ring of a workpiece chuck according to some exemplary embodiments of the present disclosure. FIG. 18 illustrates a cross-sectional view of the fixing ring with a workpiece according to some exemplary embodiments of the present disclosure. Referring to FIG. 10, FIG. 17 and FIG. 18, in some embodiments, the fixing ring 250 includes an opening 256 for revealing a center region of the gas permeable buffer 220, and the fixing ring 250 covers the peripheral region of the gas permeable buffer layer 220 to clamp the gas permeable buffer layer 220 between the fixing ring and the supporting platform. In one embodiment, the fixing ring 250 may include a groove 254 at its lower surface for receiving the peripheral region of the gas permeable buffer layer 220. The fixing ring 250 may include a plurality of screw holes 252 for the fastening components 260, such as screws, to penetrate through and fastening the fixing ring 250 along with the gas permeable buffer layer 220 to the mounting frame 240.

In accordance with some embodiments of the disclosure, the screw holes 252 may arranged along a circular path surrounding an outer rim of the fixing ring 250. In one embodiment, a diameter D2 of the gas permeable buffer layer 220 is substantially smaller than a diameter D3 of the circular path of the screw holes 252, and is substantially greater than a diameter D1 of the opening 256, i.e., an inner diameter of the fixing ring 250. Accordingly, the gas permeable buffer layer 220 can be fixed by the fixing ring 250 through the fastening components 260, and the center portion of the gas permeable buffer layer 220 can be revealed by the opening 256 of the fixing ring 250. In some embodiments, a diameter of the sealing ring 330 of the robotic device 300 shown in FIG. 15 is substantially smaller than a diameter D3 of the circular path of the screw holes 252, and is substantially greater than a diameter of the dielectric film 190, so that the sealing ring 330 would not be interfered with the fastening components 260 and the dielectric film 190. In some embodiments, an inner diameter D1 of the fixing ring 250 is substantially greater than a diameter of the dielectric film 190, and is substantially smaller than an outer diameter of the supporting platform 210 as it is shown in FIG. 14. For example, the inner diameter D1 of the fixing ring 250 may range from 280 mm to 320 mm. In the present embodiment, the inner diameter D1 of the fixing ring 250 is about 302 mm, but the disclosure is not limited thereto.

Figure 19:
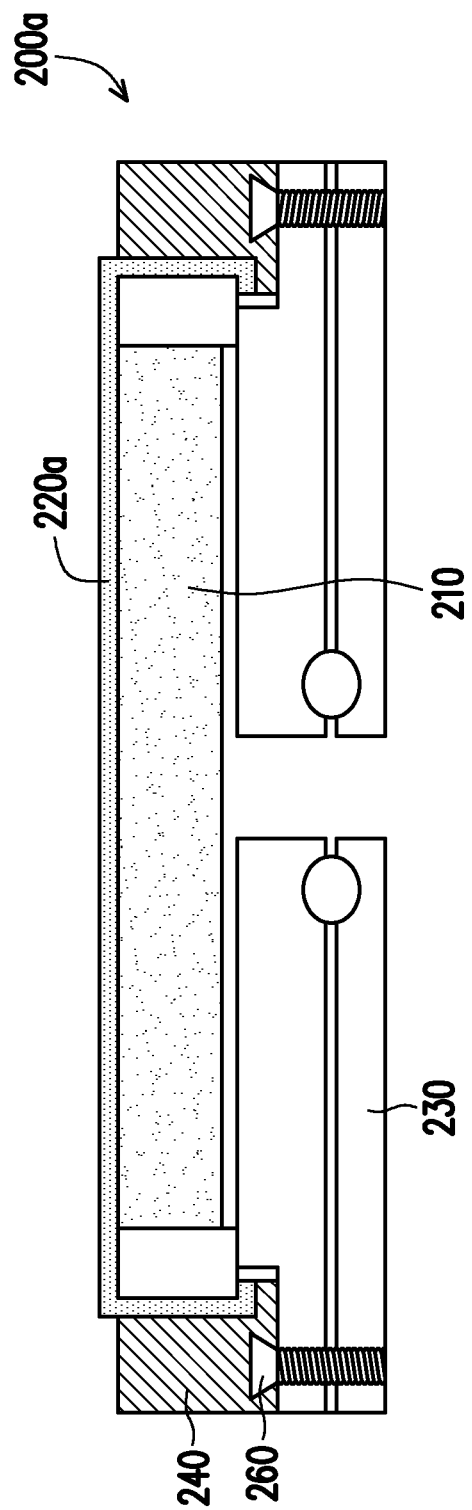
FIG. 19 illustrates a cross-sectional view of a workpiece chuck according to some exemplary embodiments of the present disclosure.
Figure 20:
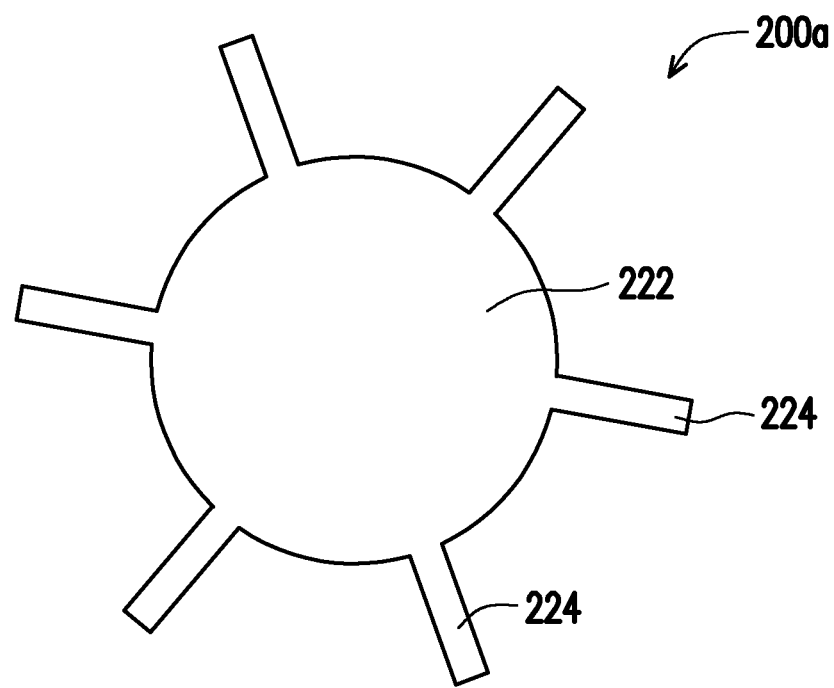
FIG. 20 illustrates a top view of a gas permeable buffer layer according to some exemplary embodiments of the present disclosure.
Figure 21:
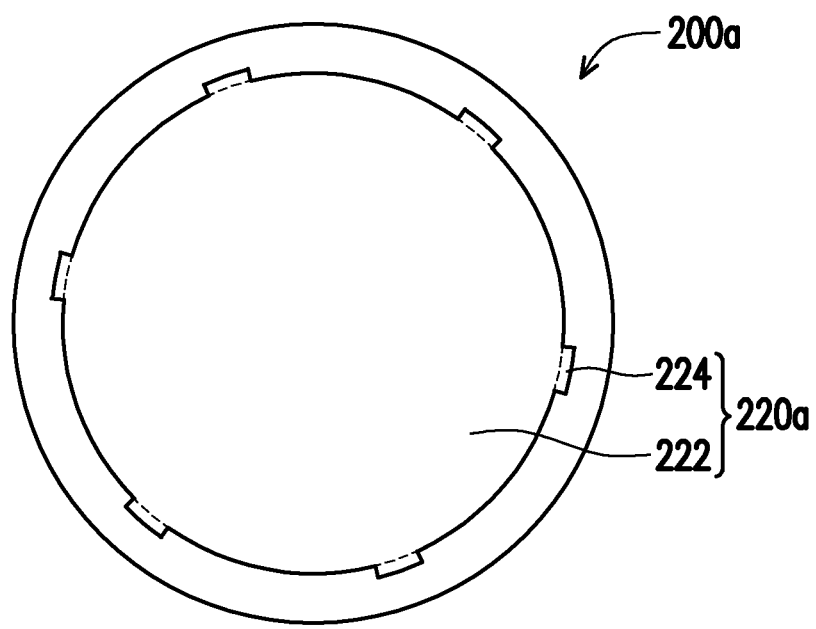
FIG. 21 illustrates a top view of a workpiece chuck according to some exemplary embodiments of the present disclosure.

FIG. 19 illustrates a cross-sectional view of a workpiece chuck according to some exemplary embodiments of the present disclosure. FIG. 20 illustrates a top view of a gas permeable buffer layer according to some exemplary embodiments of the present disclosure. FIG. 21 illustrates a top view of a workpiece chuck according to some exemplary embodiments of the present disclosure. It is noted that the workpiece chuck 200a shown in FIG. 19 to FIG. 21 contains many features same as or similar to the workpiece chuck 200 disclosed in the previous embodiments. For purpose of clarity and simplicity, detail description of same or similar features may be omitted, and the same or similar reference numbers denote the same or like components.

With now reference to FIG. 19 to FIG. 21, in some embodiments, the gas permeable buffer layer 220 includes a core portion 222 and a plurality of extending portions 224. The core portion 222 covers the supporting surface of the supporting platform 210 and the extending portions 224 are radially arranged around a perimeter of the core portion 222. Accordingly, the extending portions 224 are bent down to be clamped between the supporting platform 210 and the vacuum system 230. In some embodiments, the extending portions 224 may be bent down to cover a side surface of the supporting platform 210 and may further cover a part of a bottom surface of the supporting platform 210. The mounting frame 240 surround the side surface of the supporting platform 210 and clamp the gas permeable buffer layer 220 between the supporting platform 210 and the mounting frame 240. The gas permeable buffer layer 220 is further extended to cover a part of a bottom surface of the supporting platform 210 and to be clamped between the supporting platform 210 and the vacuum system 230. In such embodiments, the fixing ring 250 shown in FIG. 16 may not be needed. As such, the fastening components 260 may not have to penetrate through the mounting frame 240 for fixing the fixing ring. Accordingly, the components and the assembling method of the workpiece chuck 200a can be simplified.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a workpiece chuck includes a supporting platform, a vacuum system, and a gas permeable buffer layer. The supporting platform has a supporting surface for holding a workpiece thereon. The vacuum system is disposed under and in gas communication with the supporting platform. The gas permeable buffer layer is disposed over the supporting platform and covers the supporting surface, wherein a hardness scale of the gas permeable buffer layer is smaller than a hardness scale of the supporting platform. In an embodiment, a material of the gas permeable buffer layer comprises rubber, silicone, polytetrafluoroethylene (PTFE). In an embodiment, a porosity of the gas permeable buffer layer substantially ranges from 30% to 70%. In an embodiment, a thickness of the gas permeable buffer layer substantially ranges from 0.3 mm to 0.7 mm. In an embodiment, the gas permeable buffer layer includes a core portion covering the supporting surface of the supporting platform and a plurality of extending portions radially arranged around a perimeter of the core portion, the plurality of extending portions are bent down to be clamped between the supporting platform and the vacuum system. In an embodiment, the workpiece chuck further includes a fixing ring disposed on the gas permeable buffer layer, wherein a peripheral region of the gas permeable buffer layer is clamped between the fixing ring and the supporting platform. In an embodiment, the workpiece chuck further includes a mounting frame surrounding the supporting platform for fixing the supporting platform to the vacuum system, wherein the fixing ring is fixed to the mounting frame by a plurality of fastening components extending through the fixing ring, and the mounting frame. In an embodiment, an inner diameter of the fixing ring is substantially greater than a diameter of the workpiece, and is substantially smaller than an outer diameter of the supporting platform.

In accordance with some embodiments of the disclosure, a workpiece handling apparatus includes a workpiece chuck, and a robotic device. The workpiece chuck is for holding a workpiece thereon, wherein the workpiece chuck includes a porous supporting platform, a gas permeable buffer layer covering a supporting surface of the porous supporting platform, and a vacuum system in gas communication with the porous supporting platform and the gas permeable buffer layer. The robotic device is movably disposed over the workpiece chuck for picking up the workpiece and placing the workpiece on the gas permeable buffer layer. In an embodiment, a hardness scale of the gas permeable buffer layer is smaller than a hardness scale of the porous supporting platform. In an embodiment, a material of the gas permeable buffer layer comprises rubber, silicone, polytetrafluoroethylene (PTFE). In an embodiment, a material of the porous supporting platform comprises aluminum oxide ($Al_2O_3$), silicon carbide (SiC), or silicon nitride ($Si_3N_4$). In an embodiment, the robotic device includes a robot arm movably disposed over the workpiece chuck, an end effector connected to the robot arm, and a vacuum manifold in gas communication with the end effector, wherein the end effector is configured to hold the workpiece thereon through a suction force provided by the vacuum manifold. In an embodiment, the robotic device further includes a seal ring surrounding a perimeter of the end effector. In an embodiment, the workpiece chuck further includes a fixing ring disposed on the gas permeable buffer, wherein a peripheral region of the gas permeable buffer layer is clamped between the fixing ring and the porous supporting platform. In an embodiment, the workpiece handling apparatus further includes a mounting frame surrounding the porous supporting platform for fixing the porous supporting platform to the vacuum system, wherein the fixing ring is fixed to the mounting frame.

In accordance with some embodiments of the disclosure, a manufacturing method of a semiconductor package includes the following steps. A backside redistribution structure is formed over a carrier. An encapsulated semiconductor device is formed over the backside redistribution structure. A front side redistribution structure is formed over the encapsulated semiconductor device to form a package structure. The carrier is removed from the package structure and reveals a back surface of the backside redistribution structure. A dielectric film is formed over a workpiece chuck, wherein the workpiece chuck includes a porous supporting platform, and a gas permeable buffer layer covering a supporting surface of the porous supporting platform, wherein the gas permeable buffer layer is sandwiched between the dielectric film and the porous supporting platform. The dielectric film is attached to the package structure by pressing the package structure against the dielectric film on the gas permeable buffer layer. In an embodiment, the dielectric film provided over the workpiece chuck further includes picking up the dielectric film and placing the dielectric film on the gas permeable buffer layer by a robotic device. In an embodiment, providing the dielectric film over the workpiece chuck further includes: applying a suction force by the robotic device to pick up the dielectric film; moving the dielectric film toward the workpiece chuck by the robotic device; and providing a flow by the robotic device to push the dielectric film toward the workpiece chuck when the robotic device is in contact with the workpiece chuck. In an embodiment, the workpiece chuck further includes a vacuum system for providing a suction force when the dielectric film is placed on the gas permeable buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A workpiece chuck, comprising:
   a supporting platform having a supporting surface for holding a workpiece thereon;
   a vacuum system disposed under and in gas communication with the supporting platform; and
   a gas permeable buffer layer fixed onto the supporting platform and covering the supporting surface, wherein a hardness scale of the supporting platform is at least 3 times greater than a hardness scale of the gas permeable buffer layer.

2. The workpiece chuck as claimed in claim 1, wherein a material of the gas permeable buffer layer comprises rubber, silicone, polytetrafluoroethylene (PTFE).

3. The workpiece chuck as claimed in claim 1, wherein a porosity of the gas permeable buffer layer substantially ranges from 30% to 70%.

4. The workpiece chuck as claimed in claim 1, wherein a thickness of the gas permeable buffer layer substantially ranges from 0.3 mm to 0.7 mm.

5. The workpiece chuck as claimed in claim 1, wherein the gas permeable buffer layer comprises a core portion covering the supporting surface of the supporting platform and a plurality of extending portions radially arranged around a perimeter of the core portion, the plurality of extending portions are bent down to be clamped between the supporting platform and the vacuum system.

6. The workpiece chuck as claimed in claim 1, further comprising a fixing ring disposed on the gas permeable buffer layer, wherein a peripheral region of the gas permeable buffer layer is clamped between the fixing ring and the supporting platform.

7. The workpiece chuck as claimed in claim 6, further comprising a mounting frame surrounding the supporting platform for fixing the supporting platform to the vacuum system, wherein the fixing ring is fixed to the mounting frame by a plurality of fastening components extending through the fixing ring, and the mounting frame.

8. The workpiece chuck as claimed in claim 6, wherein an inner diameter of the fixing ring is substantially greater than a diameter of the workpiece, and is substantially smaller than an outer diameter of the supporting platform.

9. A workpiece chuck, comprising:
   a supporting platform having a supporting surface holding a solid dielectric film thereon;
   a vacuum system disposed under and in gas communication with the supporting platform; and
   a gas permeable buffer layer disposed over the supporting platform and covering the supporting surface, wherein a hardness scale of material of the gas permeable buffer layer is smaller than a hardness scale of material of the gas permeable buffer layer, when a workpiece is provided over the solid dielectric film, the gas permeable buffer layer is sandwiched between the solid dielectric film and the supporting platform.

10. The workpiece chuck as claimed in claim 9, wherein a thickness ratio of the gas permeable buffer layer to the solid dielectric film substantially ranges from 3 to 25.

11. The workpiece chuck as claimed in claim 9, wherein a porosity of the gas permeable buffer layer substantially ranges from 30% to 70%, and a thickness of the gas permeable buffer layer substantially ranges from 0.3 mm to 0.7 mm.

12. The workpiece chuck as claimed in claim 9, further comprising a fixing ring disposed on an uppermost surface of the gas permeable buffer layer, wherein a peripheral region of the gas permeable buffer layer is clamped between the fixing ring and the supporting platform.

13. The workpiece chuck as claimed in claim 12, wherein the fixing ring comprises a groove at a lower surface of the fixing ring for receiving the peripheral region of the gas permeable buffer layer.

14. The workpiece chuck as claimed in claim 9, further comprising a mounting frame surrounding the supporting platform and fixing the supporting platform to the vacuum system.

* * * * *